United States Patent [19]

Rieger et al.

[11] Patent Number: 5,459,690
[45] Date of Patent: Oct. 17, 1995

[54] INTEGRATED SEMICONDUCTOR MEMORY WITH REDUNDANCY ARRANGEMENT

[75] Inventors: Johann Rieger, Bad Abbach; Johann Stecker, München, both of Germany

[73] Assignee: Siemens Aktiengesellschaft, Munich, Germany

[21] Appl. No.: 920,315

[22] PCT Filed: Apr. 16, 1992

[86] PCT No.: PCT/DE92/00316

§ 371 Date: Aug. 17, 1992

§ 102(e) Date: Aug. 17, 1992

[87] PCT Pub. No.: WO93/21578

PCT Pub. Date: Oct. 28, 1993

[51] Int. Cl.⁶ .................................................. G11C 7/00
[52] U.S. Cl. ................................. 365/200; 365/230.03
[58] Field of Search ............................. 365/200, 230.03, 365/230.06, 195

[56] References Cited

U.S. PATENT DOCUMENTS

| | | | |
|---|---|---|---|
| 4,538,247 | 8/1985 | Venkateswaran | 365/200 |
| 4,752,914 | 6/1988 | Nakano et al. | 365/200 |

FOREIGN PATENT DOCUMENTS

91/14227  9/1991  WIPO.

OTHER PUBLICATIONS

"A Flexible Redundancy . . . ", Horiguchi et al., IEEE Journal of Solid–State Circuits, vol. 26, No. 1, 1991.
"Nonvolatile Memories", Naruke et al., IEEE Internat. Solid–State Circuits Conference, 1989, pp. 128/129/311.
"Dynamic RAMs", Arimoto et al., IEEE, 1989, pp. 244/245 and 352.
"High–Speed SRAMs", Sasaki et al., IEEE, 1989, pp. 34/35/282.
"Nonvolatile Memories", Terada et al., IEEE, 1989, pp. 136/137/315.
"Dynamic RAMs", Miyaji et al., IEEE, 1989, pp. 250/251/355.
"Nonvolatile Memories", Canepa et al., IEEE, 1988, pp. 120/121/323.
"Nonvolatile Memories", Fukushi et al., IEEE, 1988, pp. 134/135/331.
"An Experimental 1Mb CMOS SRAM with Configurable . . . ", Lee et al., IEEE, 1988, pp. 180/181/359.
"Static RAMs", Flannagan et al., IEEE, 1988, pp. 182/183/360.

(List continued on next page.)

Primary Examiner—Joseph A. Popek
Assistant Examiner—A. Zarabian
Attorney, Agent, or Firm—Herbert L. Lerner; Laurence A. Greenberg

[57] ABSTRACT

An integrated semiconductor memory has a block decoder BKDEC having block selection signals BKS and a plurality of main memory area block units BK which can be individually activated. The main memory area block units BK contain memory locations which can be selected via word and bit lines NWL, NBL, $\overline{NBL}$ and redundancy memory locations RMC, which can be selected via redundancy word lines RWL. The main memory area block units BK contain programmable redundancy block decoders RBK, which in conjunction with redundancy word line decoders RWDEC enable the selection of redundancy word lines RWL. If a redundancy word line RWL is to be selected, it is exclusively that main memory area block unit BK in which the redundancy word line RWL that is to be selected is contained that is activated. In this case, activation which is otherwise usual is suppressed via an appropriate block selection signal BKS. It is rendered possible in this way that the redundancy word line RWL that is to be selected together with its redundancy memory locations RMC can be arranged in a different main memory area block unit BK from the memory locations to be replaced together with their normal word lines NWL, but also in an (any) other main memory area block unit BK. It is possible in this way to increase the yield in the production of integrated semiconductor memories.

16 Claims, 8 Drawing Sheets

OTHER PUBLICATIONS

"A 1.2ns HEMT 64kb SRAM", Suzuki et al., IEEE, 1991, pp. 48/49/287.

"7ns $Mb MiCMOS with Parallel Testing Circuit", Okajima et al., IEEE, 1991, pp. 54/55/289.

"A62ns 16 Mb CMOS EPROM with Address Transition . . . ", Ohtsuka et al., IEEE, 1991, pp. 262/263/326.

"A15ns 16MB CMOS with Reduced Voltage Amplitude . . . ", Matusmiya et al., IEEE, 1992, pp. 214/215/287.

INTEGRATED SEMICONDUCTOR MEMORY WITH REDUNDANCY ARRANGEMENT

BACKGROUND OF THE INVENTION

Field of the Invention

The invention relates to an integrated semiconductor memory with a redundancy arrangement.

In modern integrated semiconductor memories, the memory cells are disposed in a plurality of memory field block units of one to several memory field blocks. In operation, for the sake of saving current and time, only one memory field block unit is activated at a time, as a function of address signals. To increase the yield in manufacturing these semiconductor memories, it has long been known to provide so-called redundant word lines with redundant memory cells along the redundant word lines. Memories with a plurality of memory field block units accordingly have a further one to 8 or 16 redundant word lines with redundant memory cells in the memory field block units, in addition to the normal word lines with normal memory cells. In case of need, in other words if redundant memory cells are intended to replace defective normal memory cells ("redundancy situation"), the redundant word lines are triggered instead of the normal word lines. As is known, this is done via so-called redundancy decoders, which are programmable to the address of the applicable normal word line with the defective memory cells to be replaced (the programming is to be done via so-called fuses, which can be interrupted by means of electric current or a laser beam).

To increase the effectiveness of such redundancy provisions, various redundancy architectures are presented in an article entitled "A Flexible Redundancy Technique for High Density DRAM's" IEEE Journal of Solid-State Circuits, Vol. 26, No. 1, January 1991, pp. 12–17. A common feature of all the architectures is that in each individual memory field block unit, only a maximum of as many normal word lines as corresponds to the number of redundant word lines of such a memory field block unit can be replaced with redundant word lines. In practice, this can mean that a semiconductor memory of this kind may contain more normal word lines with defective memory cells in a memory field block unit than there are redundant word lines, with corresponding redundant memory cells, in the same memory field block unit. Such a memory is then "unrepairable" with the aid of the redundant architectures known thus far, even though there may still be enough redundant word lines with redundant memory cells in other memory field block units than the memory field block unit in question, and those redundant word lines and memory cells in these other memory field block units would then not be utilized.

The object of the present invention is to create an integrated semiconductor memory with a redundancy arrangement that as needed, in other words in the presence of normal word lines with defective memory cells, enables better utilization of the redundancy arrangement.

SUMMARY OF THE INVENTION

This object is attained, in a generic semiconductor memory, with at least one programmable redundant block decoder for selection of the redundant word line decoders, both in cases in which a redundant word line to be selected, having replacement redundant memory cells, is located in the same memory field block unit as the normal line having the memory cells to be replaced, and in cases in which a redundant word line to be selected, having replacement redundant memory cells, is disposed in an arbitrary different memory field block unit from the normal word line having the memory cells to be replaced. Advantageous embodiments and further features are recited in the dependent claims.

The invention will now be described in further detail, in conjunction with the drawing. Shown are:

DESCRIPTION OF THE PREFERRED EMBODIMENTS

Figure 1:
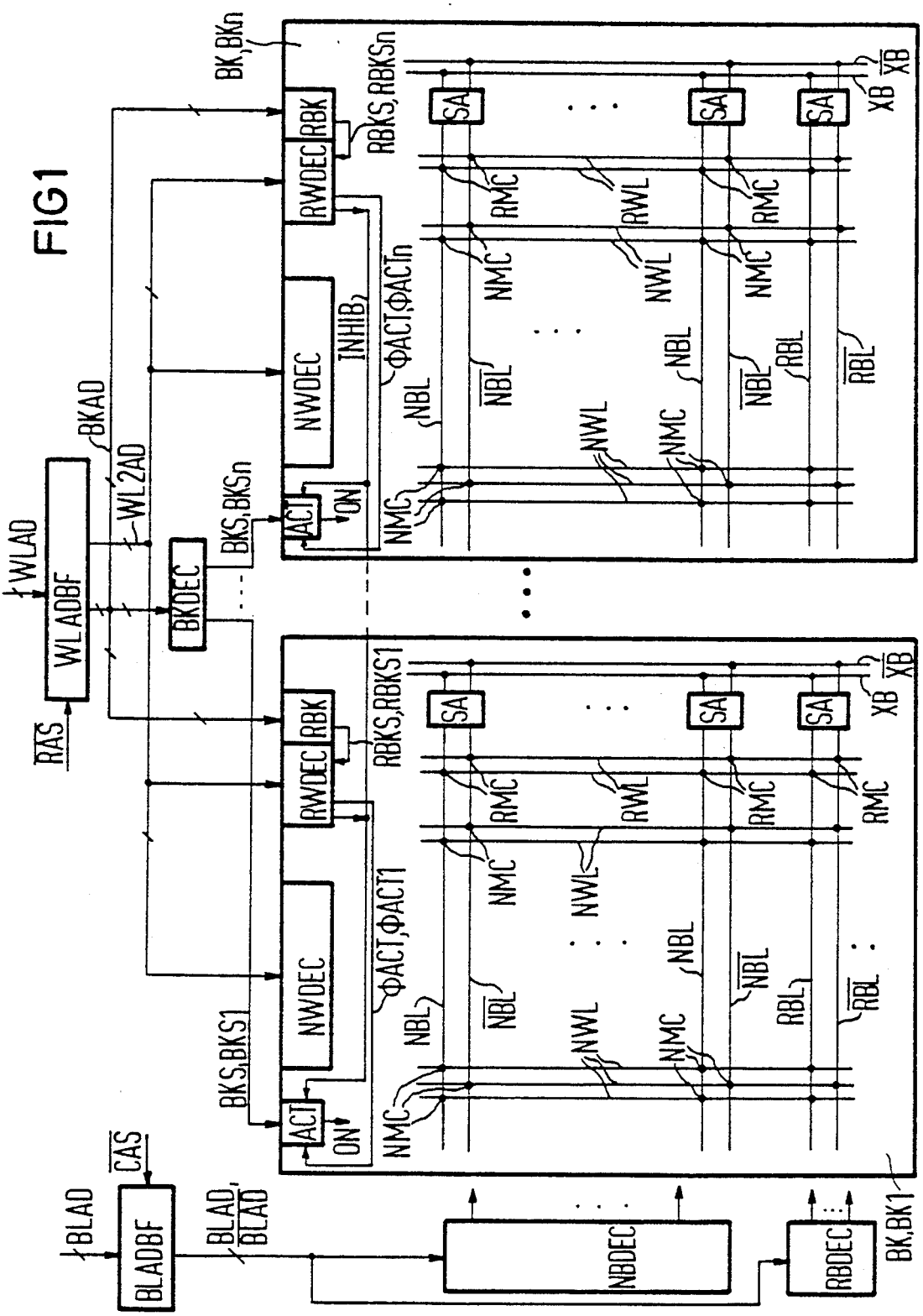
FIGS. 1–5, various embodiments of the invention in general.

FIGS. 1–5, in highly schematic form, show various embodiments of the semiconductor memory according to the invention, including some circuit parts that are already known, which although not directly involved in the invention nevertheless make it easier to understand. Activated signals and signals in the activated state are intended herein to mean signals with the state "log. 1"; otherwise, the state is "log. 0". This involves what is known as positive logic and serves merely as a simpler way of illustration. Other logic conventions are naturally possible. The semiconductor memories shown include a plurality of memory field block units BK (only two memory field block units BK are shown each time, for the sake of simplicity), containing memory cells in them. A memory field block unit BK is understood to be a unit with one or more arrays of memory cells (in other words, memory field blocks), which is activatable and operatable independently of other such units. The memory cells are divided conceptually into normal memory cells NMC and redundant memory cells RMC. Normal memory cells NMC are understood to be those memory cells whose addressing and operation can be done without the aid of any redundant circuitry means. Redundant memory cells RMC are understood as those memory cells that can be used in order to replace defective memory cells (usually normal memory cells NMC); the defect may occur either in the memory cells to be replaced themselves or in conjunction with their operation, examples being errors or defects in the associated bit lines, word lines, read amplifiers, and address decoders. The technique of using redundant memory cells instead of defective memory cells is generally known.

The normal memory cells NMC are arranged along (and are thus addressable via) normal word lines NML and along normal bit lines; each normal bit line typically includes two halves, NBL, NBL*, and along normal word lines NWL and redundant bit lines RBL, RBL*, and along redundant word lines RWL and redundant bit lines RBL, RBL*. It is the arrays along the redundant word lines RWL that are of primary interest for the present invention.

The memory cells NMC, RMC are addressable via the respective associated normal bit lines NBL, NBL*, the redundant bit lines RBL, RBL*, the normal word lines NWL, and the redundant word lines RWL, by means of address signals that can be applied to the semiconductor memory, typically by the well-known process of address multiplexing. In this process, at a first time, the word line address signals WLAD responsible for word line addressing are temporarily stored, controlled by a clock signal RAS*, in a word line address buffer WLADBF. Correspondingly, at a second time, the bit line address signal BLAD responsible for bit line addressing, controlled by a clock signal CAS*, is temporarily stored in a bit line address buffer BLADBF. At the outputs of the address buffers, these address signals then appear in true and complementary forms WLAD, WLAD*, BLAD, BLAD*.

In such semiconductor memories, as already described, not all the memory field block units BK are activated and operated simultaneously during operation; instead, only one memory field block unit BK is activated and operated at a time. This is also the case in the semiconductor memory of the invention: To that end, each memory field block unit BK can be selected by means of a block selection signal BKS associated with the applicable memory field block unit BK. The selection is made by means of a block decoder BKDEC, controlled by a first part BKAD of the word line address signals WLAD (and of the signals WLAD* complementary to them).

The memory field block units BK include normal word line decoders NWDEC and redundant word line decoders RWDEC for selecting the normal word lines NWL and the redundant word lines RWL. The selection of a normal word line NWL or of a redundant word line RWL is made inside a selected memory field block unit BK as a function of a second part WL2AD of the word line address signals WLAD, WLAD*.

Correspondingly, the semiconductor memory also includes normal bit line decoders NBDEC and redundant bit line decoders RBDEC for selecting the normal bit lines NBL, NBL* and the redundant bit lines RBL, RBL*, which is also generally typical. The selection is done by means of the bit line address signals BLAD, BLAD*.

As is well-known, the redundant word line decoders RWDEC and the redundant bit line decoders RBDEC are programmable via so-called fuses, for instance by means of laser beams or current. The redundant memory cells RMC are then addressable to replace corresponding normal memory cells NMC, if the associated decoder RWDEC (for redundant word lines) and/or RBDEC (for redundant bit lines) is programmed for the corresponding address combination. With a view to the present invention, in the ensuing description the redundant memory cells RMC that are arranged along normal word lines NWL will be handled the same as normal memory cells NMC, because as a result of their being tied to normal word lines NWL they are affected in the same way by the invention as the normal memory cells NMC, so that in this respect there is no difference between them in view of the invention.

According to the invention, a semiconductor memory of this kind in the embodiment of FIG. 1 now contains redundant block decoders RBK in each memory field block BK, which for instance are likewise programmable via fuses, and by means of which decoders, in the programmed state, the applicable memory field block unit BK can be selected and activated. Thus the redundant word line decoders RWDEC contained in the applicable memory field block unit BK are selectable as well. As with the block decoders BKDEC, the triggering of the redundant block decoders RBK is done by means of the first part BKAD of the word line address signals WLAD, WLAD*. Then, upon application of a combination, matching the programming, of the signals of the first part BKAD of the word line address signals WLAD, WLAD*, a programmed redundant block decoder RBK generates a redundant block selection signal RBKS corresponding to the applicable memory field block unit BK; this signal is delivered to the redundant work line decoders RWDEC of the applicable memory field block unit BK.

Figure 2:
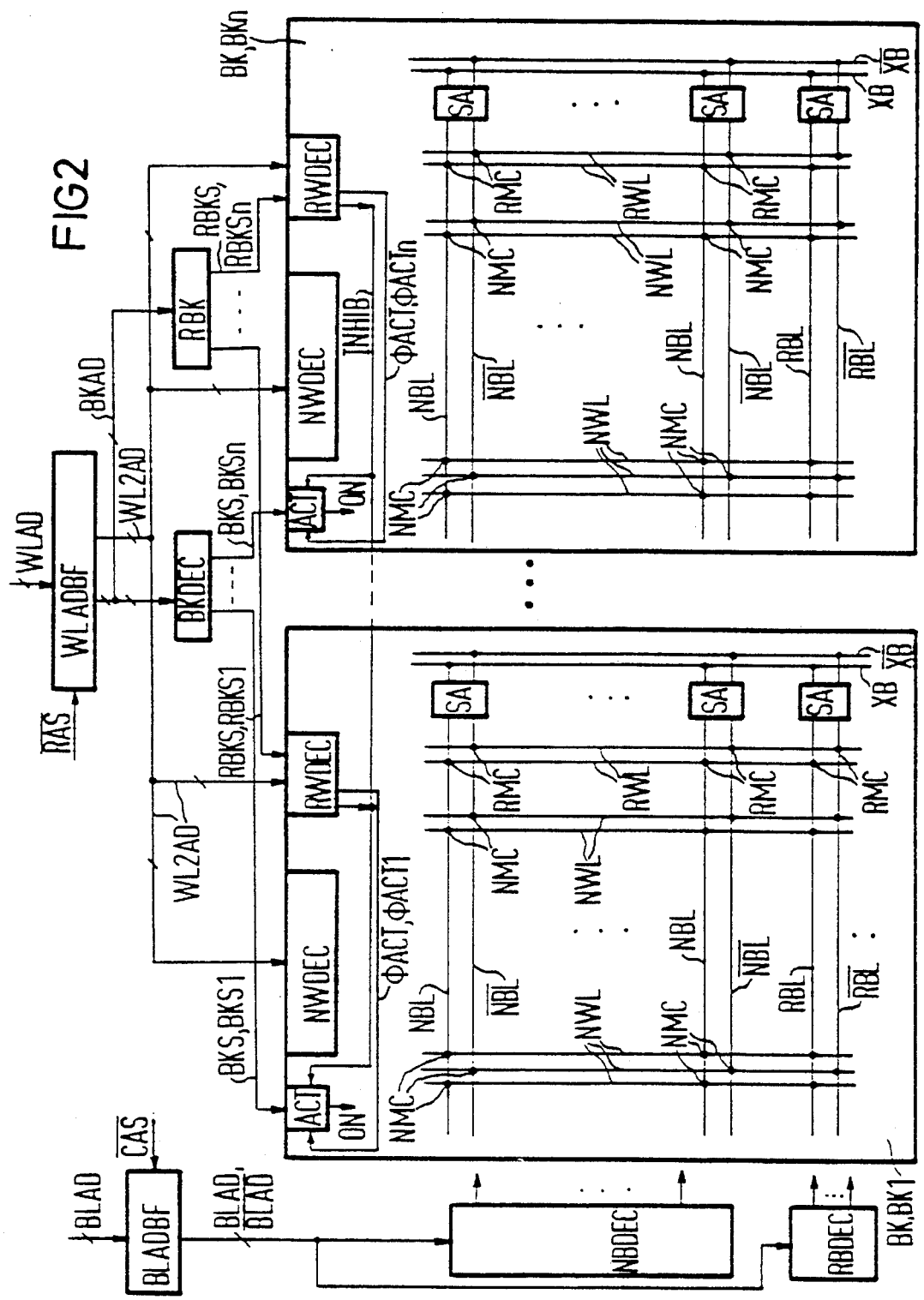

In FIG. 1, each memory field block unit BK includes one such programmable redundant block decoder RBK. However, it is also possible to provide one programmable redundant block decoder RBK for the entire semiconductor memory in common, with corresponding redundant block selection signals RBKS, each of which can be delivered to an applicable memory field block unit BK. This is schematically shown in the embodiment of FIG. 2. FIG. 2 will be described later.

In the embodiment of FIG. 1, each programmable redundant block decoder RBK is a decoder that in the programmed state generates a redundant block signal RBKS with an activated state from the first part BKAD of the word line address signals WLAD whenever the first part BKAD of the word line address signals WLAD matches the particular memory field block unit BK that contains the normal word lines NWL with memory cells to be replaced.

In the embodiment of FIG. 2, contrarily, the common redundant block selection decoder RBK includes a plurality of decoders, programmable independently of one another, for redundant block selection signals RBKS. Each of the decoders is programmable with respect to one of the memory field block units BK, so that in the programmed state, the redundant block selection signal RBKS is created in the activated state, given suitable addressing.

Block selection signals BKS already known from the prior art are known to serve, in the active state, to activate the memory block field units BK associated with them, so that an activated unit of this kind can be driven. To that end, activating arrangements ACT are present in each memory field block unit BK; they activate circuit parts to be activated, such as word line drivers WLDVR (not shown for the sake of simplicity) connected to the output side of the word line decoders; precharge arrangements for precharging the bit lines NBL, NBL*, RBL, RBL*; and signals and signal generators for controlling the read amplifiers SA, and the like. This activating action of the activating units ACT is represented in summary form with a signal ON shown in FIGS. 1–5.

The semiconductor memory according to the invention now has an inhibit signal INHIB, common to all the memory field block units BK, which [missing], whenever any of the various programmed redundant word line decoders RWDC, in an arbitrary memory field block unit BK, selects a redundant word line RWL, on the basis of the second part WL2AD of the word line address signals WLAD applied to it and of the activated redundant block selection signal RBKS of the redundant block decoder RBK assigned to it. The inhibit signal INHIB is accordingly always active in the entire semiconductor memory whenever normal memory cells NMC (along a normal word line NWL) of an arbitrary memory field block unit BK (or redundant memory cells RMC along such a normal word line NWL) are to be functionally replaced with redundant memory cells RMC along a redundant word line RWL of a likewise arbitrary, or in other words optionally different, memory field block unit BK. The normal memory cells NMC to be replaced may accordingly, as also described below, be disposed in the same memory field block unit BK as the redundant memory cells RMC to be replaced, or in a different memory field block unit BK.

According to the invention, each memory field block unit BK also has an activation signal 0ACT. Within a particular memory field block unit BK, this signal is in an activated state only whenever, on the basis of whichever word line address signals WLAD of the redundant block decoder RPK of and of the redundant word line decoder RWDEC are present, redundant memory cells RMC along redundant word lines RWL are addressed for the functional replacement of normal memory cells NMC; the normal memory cells NMC to be replaced may be disposed in an arbitrary memory field block unit BK, as will also be described hereinafter. In the activated state, the activating signal 0ACT takes on the role, within whichever memory field block unit BK it occurs in, of the block signal BKS normally (in other words without use or activation of the redundancy) assigned to this memory field block unit BK, cancelling the aforementioned action of the inhibit signal INHIB for this one memory field block unit BK.

The function of the above-described semiconductor memory according to the invention will be described below by way of example, in conjunction with FIG. 1. In a first case, the readout of information from normal memory cells NMC will be described first, and then in a second case the readout of information from redundant memory cells RMC, which are assumed to be intended to functionally replace normal memory cells NMC.

The following assumptions are made in the example: The memory field block unit BK shown on the left is identified as BK1, to enable distinguishing it in terms of its reference symbol from the memory field block unit BK on the right, which is marked BKn. The combination of word line address signals WLAD to be applied to the semiconductor memory is assumed to serve to address normal memory cells NMC in the left-hand memory field block unit BK1 in the first case, in which these normal memory cells NMC are not to be replaced by redundant memory cells RMC.

In the other, second case, a combination of word line address signals WLAD is applied to the semiconductor memory, and the normal memory cells NMC corresponding to this combination, which are likewise assumed to be disposed in the left-hand memory field block unit BK1, are replaced with corresponding redundant memory cells RMC. In the redundant architectures of the prior art, discussed at the outset above, these redundant memory cells RMC, because of the arrangement of normal memory cells NMC in the left-hand memory field block unit BK1, would necessarily have to be disposed in the same, left-hand memory field block unit BK1. Although this is also possible in the present invention, it is not absolutely necessary. Instead, these redundant memory cells RMC may also be disposed in some other one of the memory field block units BK. To indicate this, a disposition in the right-hand memory field block unit BKn is assumed here.

In the first case, that is, the readout of information from normal memory cells NMC in the left-hand memory field block unit BK1, by definition none of the redundant word line decoders RWDEC and none of the redundant block decoders RBK are programmed in such a way that this would lead to replacement of the normal memory cells NMC with redundant memory cells RMC. When the selected combination of word line address signals WLAD and of the clock signal RAS, is applied, the word line address signals WLAD are transferred to the word line address buffer WLADBF, where they are temporarily stored in a true form (WLAD) and in their complementary form (WLAD*), in the familiar manner.

The first part BKAD of the thus buffer-stored word line address signals WLAD, WLAD* is delivered to the block decoder BKDEC. It generates the block selection signal BKS1 responsible for the left-hand memory field block unit BK1; this signal selects and activates the left-hand memory field block unit BK1. The remaining block selection signals BKS, which are responsible for the remaining memory field block units BK, including the right-hand memory field block unit BKn with its associated block selection signal BKSn, remain inactive, or in other words in the nonselected state, as a result of which the remaining memory field block units are neither selected nor activated.

The second part of the buffer-stored word line address signals WLAD, WLAD, is applied to the normal word line decoders NWDEC of all the memory field block units BK. However, only the normal word line decoder NWDEC contained in the left-hand memory field block unit BK1 (because of the second part WL2AD of the word line address signals WLAD), selects the normal word line NWL corresponding to the combination of word line address signals WLAD applied to the semiconductor memory, because only the block selection signal BKS1 of the left-hand memory field block unit BK1 is activated. The normal word line decoders NWDEC of the remaining memory field block units BK (including BKn) remain inactive, because their block selection signals BKS (including BKSn) are inactive, because of the first part BKAD of the word line address signals WLAD.

In the left-hand memory field block unit BK1, the block selection signal BKS1 also has the effect of generating and activating all the signals necessary for the function of the left-hand memory field block unit BK1, by means of the activation arrangement ACT, so that the left-hand memory field block unit BK1 can also be driven (for example to carry out the precharging process on the bit lines, activate the read amplifiers SA, and so forth). The addressing of the normal bit lines NBL, NBL*, or optionally the redundant bit lines RBL, RBL*, is done as in the prior art via bit line address buffers BLADBF, bit line address signals BLAD, BLAD*, a clock signal CAS*, and normal bit line decoders NBDEC or optionally redundant bit line decoders RBDEC (to address those redundant memory cells RMC along redundant bit lines RBL, RBL* that simultaneously are also disposed along the normal word lines NWL, although in the present case this is unaffected by the redundancy concept of the invention).

In this way, information from memory cells (NMC, or optionally RMC) along the addressed normal word line NWL can accordingly be read out, evaluated, amplified, and sent over an existing data bus XB, XB, to be sent onward, for instance to a data output terminal DO of the semiconductor memory.

In the second case, a combination of word line address signals WLAD and bit line address signals BLAD is applied to the semiconductor memory, by means of which in the normal case, in other words when there would be no redundant word line RWL to be selected, and likewise a normal word line NWL in the left-hand memory field block unit BK1 would be selected. The bit line decoding and addressing are done as in the first case. Because of the present invention, in the second case the word line addressing is done completely differently from the first case, however, because of the replacement that is to be made. The following assumptions apply to this example: Along whichever word line NWL of the left-hand memory field block unit BK1 that would be addressed in the normal case, or in other words upon "non-replacement" at least one normal memory cell NMC is assumed to have been detected as defective, for example in an earlier test run. In order to enable driving the semiconductor memory properly despite this, all the memory cells, in other words all the normal memory cells NMC and all the redundant memory cells RMC (if any) that are disposed along this normal word line NWL are therefore to be functionally replaced with an equal number of redundant memory cells RMC along a redundant word line RWL. In the above-discussed redundant architectures of the prior art, such a redundant word line RWL must be disposed in the same memory field block unit BK as the normal word line NWL whose memory cells are to be functionally replaced. Such an arrangement is also possible in the semiconductor memory of the invention. Additionally, however, it is also possible for this redundant word line RWL to be disposed in one of the remaining memory field block units BK. It is assumed by way of example here that this redundant word line RWL is disposed in the right-hand memory field block unit BKn. To enable addressing this redundant word line RWL in the right-hand memory field block unit BKn, the semiconductor memory must therefore, after detection of the error but before the operation in the "repaired" state (that is, the second case) to be described hereinafter, be "adjusted" to that state. To that end, the redundant block decoder RBK of the right-hand cell field block unit BKn is programmed to the particular combination of the first part BKAD of the word line address signals WLAD, WLAD* that when applied to the block decoder BKDEC activates the block selection signal BKS1 responsible for the left-hand cell field block unit BK1. The redundant block decoder RBK is assumed to be decoder provided with fuses, similar to the conventional (and long-familiar) redundant decoders. The programming is done by interruption (by means of current or a laser beam, for instance) of whichever ones of the fuses that are the basis for reaction by the redundant block decoder RBK to the predetermined combination if this combination is applied.

Correspondingly, the redundant word line decoder RWDEC of the right-hand memory field block unit BKn is also programmed to the address of whichever normal word line NWL of the left-hand memory field block unit BK1 (likewise via fuses, as is well known) that contains the memory cells to be replaced.

With these preparatory provisions, which need be done only once, the semiconductor memory of the invention is then ready for operation in the second case: Upon application of the address-specific combination of word line address signals WLAD to the semiconductor memory, the block selection signal BKS1 responsible for the left-hand memory field block unit BK1 is generated by means of the first part BKAD of the word line address signals WLAD via the block decoder BKDEC (as in the first case, and as in the redundant architectures of the prior art). At the same time, however (because of the programming performed), the redundant block decoder RBK of the right-hand memory field block unit BKn activates the redundant block selection signal RBKSn, likewise by means of the first part BKAD of the word line address signals WLAD.

This signal activates the redundant word line decoders RWDEC associated with it, namely the redundant word line decoders RWDEC of the right-hand memory field block unit BKn. Whichever one of the redundant word line decoders RWDEC of the right-hand memory field block unit BKn is responsible for selecting the desired redundant word line RWL (on the basis of the programming done) selects the desired redundant word line RWL and activates it (for instance via a word line driver circuit WLDVR assigned to it, which is not shown for the sake of simplicity and since it is well known).

At the same time, this redundant word line decoder RWDEC activates the aforementioned inhibit signal INHIB, which is supplied to all the memory field block units BK. The inhibit signal INHIB serves to inhibit the action of the block selection signals BKS in all the memory field block units BK; in other words, the activating units ACT remain inactivated. In the present second case, it is thus attained that the block signal BKS1 in the left-hand memory field block unit BK1, which signal is activated by the block decoder BKDEC, cannot develop any action (the remaining block selection signals BKS are not activated anyway, because of the combination, selected for this example, of word line address signals WLAD—and hence of the first part BKAD of the word line address signals WLAD). Thus in the present example, the left-hand memory field block unit BK1 is (also) inactive.

The redundant word line decoder RWDEC selected in the right-hand memory field block unit BKn continues to generate an activation signal 0ACTn. This activation signal 0ACTn now takes on the role, in the right-hand memory field block unit BKn, of the block selection signal BKSn actually intended for the right-hand memory field block unit BKn; that is, the right-hand memory field block unit BKn is activated by means of its activation unit ACT, so that the desired readout of information from the redundant memory cells RMC to be addressed can also actually occur.

The present invention accordingly makes it possible to functionally replace normal and redundant memory cells NMC, RMC along a normal word line NWL with redundant memory cells RMC along a redundant word line RWL, regardless of whether the redundant memory cells RMC intended for the replacement (and thus their associated redundant word line RWL) are disposed in the same memory field block unit BK as the memory cells to be replaced, or in some other memory field block unit BK instead. The memory field block unit BK activated is always only the one in which the redundant memory cells RMC to be replaced are physically contained.

The embodiment of FIG. 2, as already noted, shows an integrated semiconductor memory, in which a single programmable redundant block decoder RBK is provided, specifically outside the memory field block units BK. The programmable redundant block decoder RBK may be a programmable decoder arrangement with a number of decoders corresponding to the number of memory field block units BK having redundant word lines RWL. It has a number of redundant block selection signals RBKS corresponding to the number of memory field block units BK with redundant word lines RWL; a given redundant block selection signal RBK is connected to the redundant word line decoders RWDEC of a given memory field block unit BK. The redundant block decoder RBK is programmable in such a way that one or more of its redundant block selection signals RBKS is activated at a time, if it appears possible, from the programming done and from the combination of signals of the first part BKAD of the word line address signals WLAD applied in an individual case, that redundant memory cells RMC are to be addressed. Whether redundant memory cells RMC are in fact to be addressed depends then on which combination of signals of the second part WL2AD of the word line address signals WLAD is applied to the semiconductor memory, and thus to the redundant word line decoders RWDEC of the memory field block units BK. In such a case, the memory field block unit BK that is activated by its activating unit ACT will be the one within which a thus-selected redundant word line decoder RWDEC activates the activation signal 0ACT.

In a case in which it is assumed that a first one of the memory field block units BK (for instance, the left-hand memory field block unit BK1) contains a plurality of normal word lines NWL whose normal memory cells NMC are to be replaced, and in which the corresponding redundant word lines RWL intended for the replacement are disposed in more than one memory field block unit BK, a plurality of decoder arrangements of the one programmable redundant block decoder RBK should be programmed for the same combination of signals of the first part BKAD of the word line address signals WLAD, namely to the combination corresponding to the left-hand memory field block unit BK1. When the word line address signals WLAD having this combination of their first part BKAD are applied, a plurality of redundant block selection signals RBKS are accordingly activated as well. On the basis of the special combination of signals of the second part WL2AD of the word line address signals WLAD that is applied, which corresponds to a special normal word line NWL to be replaced in the first memory field block unit BK, however, only the particular redundant word line decoder RWDEC which corresponds to the special redundant word line RWL intended for the replacement (because of its programming) is addressed. However, by definition this redundant word line decoder RWDEC is contained in only one of the memory field block units BK, so that only this one memory field block unit BK is in fact activated by its activation signal 0ACT, even though a plurality of redundant block selection signals RBKS have been activated. The semiconductor memory of the invention accordingly makes it possible, if defective memory cells are located along a plurality of normal word lines NWL of a memory field block unit BK, for a functional replacement of these memory cells to take place, in such a form that the redundant memory cells RMC to be replaced, along with their associated redundant word lines RWL, can be disposed in a plurality of different memory field block units BK, as a result of which a pronounced increase in the yield in manufacture is obtained. This is not possible in semiconductor memories of the prior art.

Figure 3:
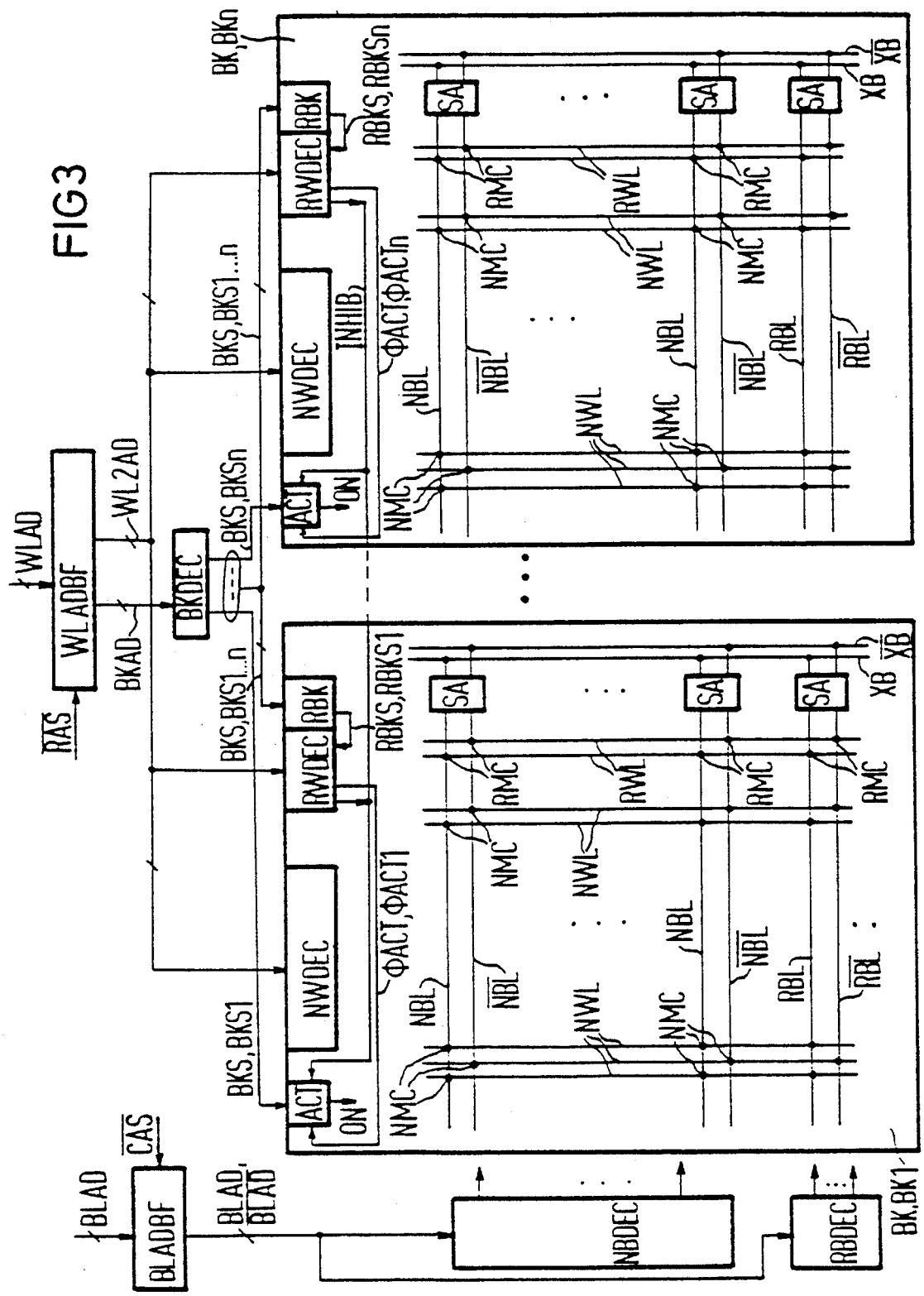
Figure 4:
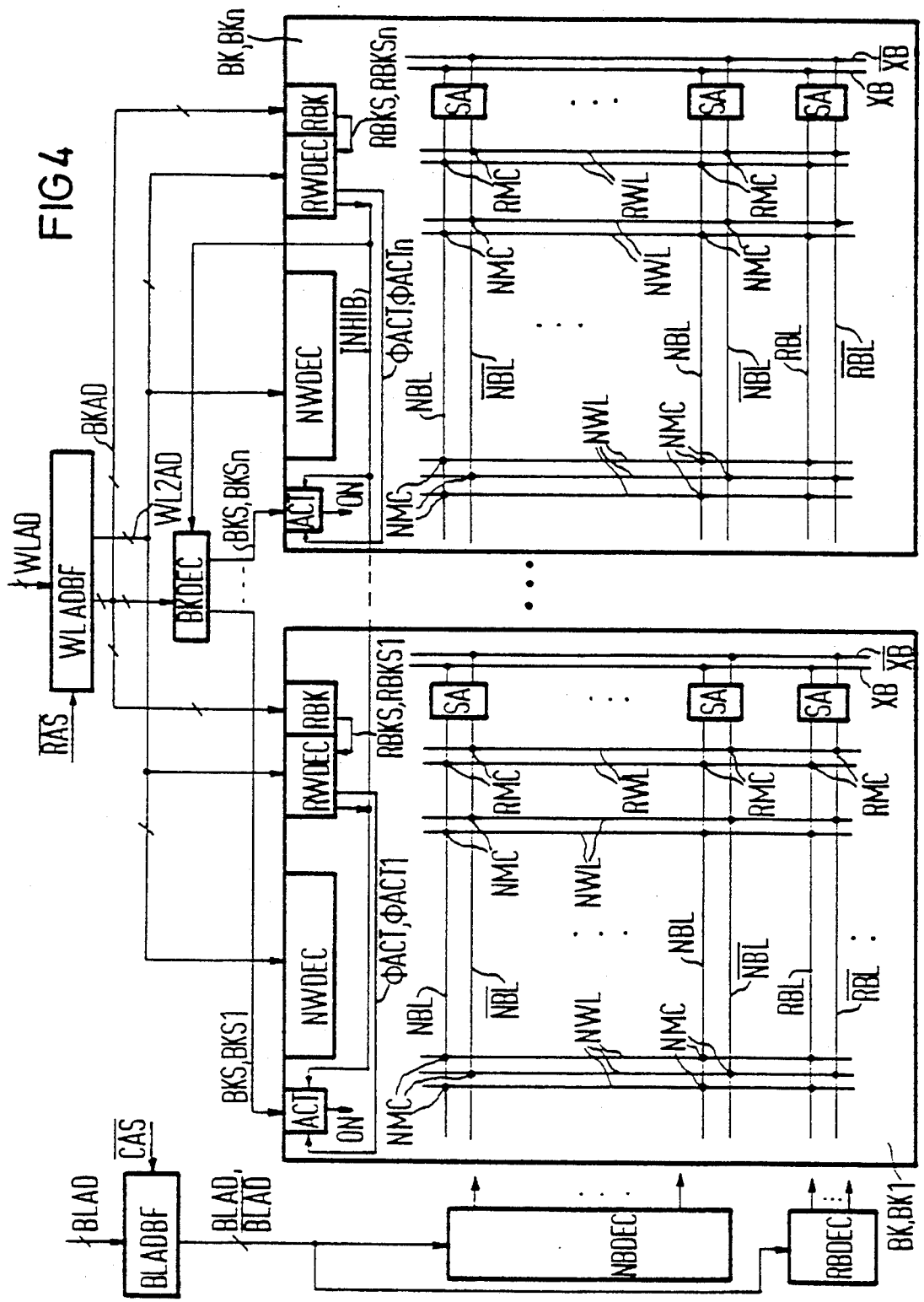

The embodiment of FIG. 3 shows a version of the semiconductor memory of the invention that is similar to that of FIG. 1. However, there is the following difference: In FIG. 1, the programmable redundant block decoders RBK are triggered by the first part BKAD of the word line address signals WLAD. In the embodiment of FIG. 4, contrarily, all the programmable redundant block decoders RBK are instead triggered by all the block selection signals BKS. Whichever redundant block decoder RBK is disposed in the memory field block unit BK that contains the redundant memory cells RMC that are intended to replace memory cells along normal word lines NWL of an arbitrary memory field block unit is then supposed to be programmed such that it activates the particular redundant word line decoder RWDEC, by which the redundant word line RWL along which the aforementioned redundant memory cells RMC are disposed is selectable, only whenever, of the block selection signals BKS applied to it, the particular block selection signal BKS that would activate the aforementioned memory field block unit BK by means of its activating unit ACT in the normal case (that is, when no replacement situation is present) is activated.

This version has the following advantage: As already noted at the outset, one memory field block unit BK may have more than one memory field block, for instance two of them, which are each activatable in common by means of an associated block selection signal BKS. These memory field blocks of a memory field block unit BK need not, however, necessarily be disposed physically side by side on the chip of the semiconductor memory. Instead, it is also possible for them to be spatially separated from one another. For instance, one memory field block with redundant word lines RWL of a memory field block unit BK may be disposed along a left-hand side of the chip, while the other memory field block of the same memory field block unit BK (possible with further redundant word lines RWL), is disposed axially-symmetrically with an imaginary center line of the chip, on a right-hand edge of the chip. This is already known from the prior art. In such a case, the block selection signal BKS responsible for the memory field block unit BK in question must be delivered both to that memory field block and to the other memory field block of the memory field block unit BK in question. Consequently, this block selection signal BKS must be carried crosswise over the entire semiconductor chip (which is also known from the prior art). If this kind of known semiconductor memory is then combined with the teaching of the invention, as shown and discussed in conjunction with FIG. 3, then the already-existing lines of the block selection signals BKS can be used for the redundant block decoders RBK. Compared with the embodiment of FIG. 1, additional advancing of the lines of the first part BKAD of the word line address signals WLAD can be dispensed with. This is true particularly whenever the redundant block decoders RBK are part of the applicable redundant word line decoders RWDEC, which is also feasible (see FIG. 8; to be described hereinafter).

The embodiment of FIG. 4 differs from that of FIG. 1 in that the inhibit signal INHIB is also linked with the block decoder BKDEC. If the inhibit signal INHIB is activated during operation by any of the redundant word line decoders RWDEC, then this decoder also deactivates the block decoder BKDEC, so that that decoder does not activate any of the block selection signals BKS.

Figure 5:
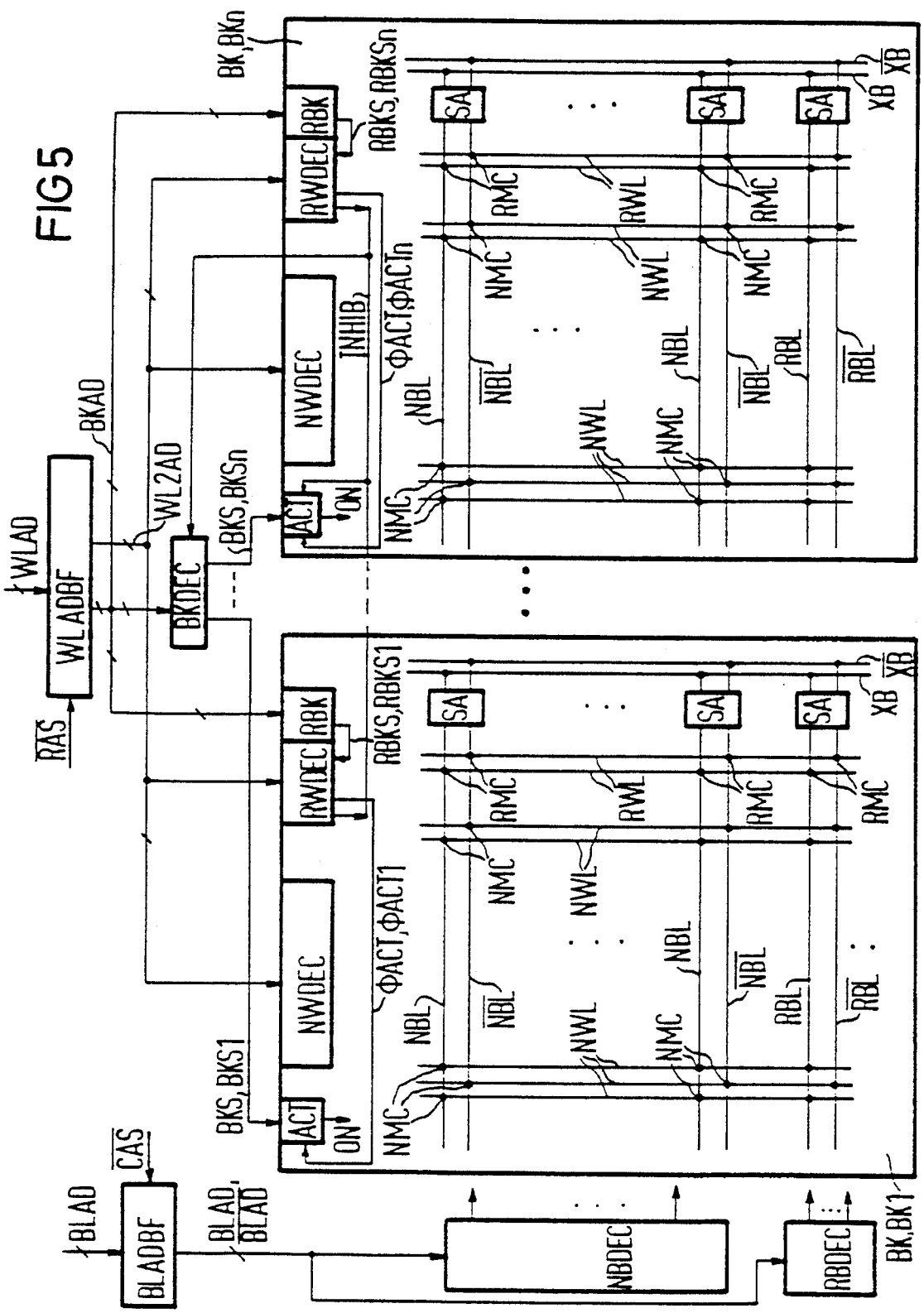

The embodiment of FIG. 5 is a variant of the embodiment of FIG. 4: although once again the inhibit signal INHIB is delivered to the block decoder BKDEC, with the same effect as described in FIG. 4, in FIG. 5 the inhibit signal INHIB is not (in contrast to the embodiments of FIGS. 1–4) linked with the activation units ACT, so that they cannot be deactivated via the inhibit signal INHIB. Nor is that necessary, however, because in any case they are not activatable via block selection signals BKS, because of the influence of the inhibit signal INHIB on the block decoder BKDEC.

Figure 6:
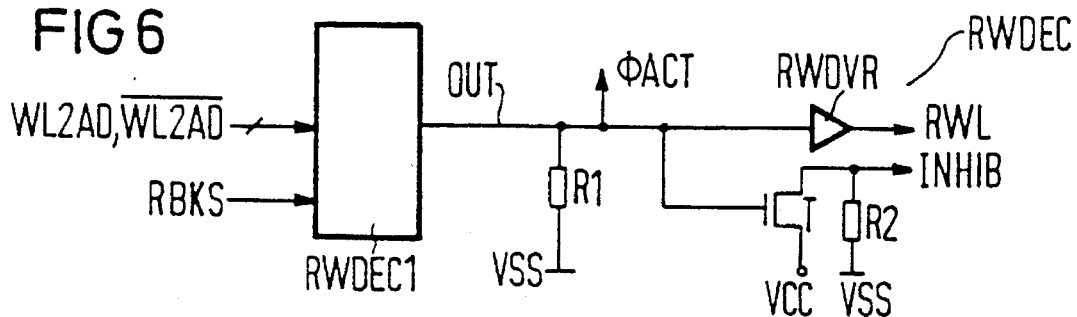
FIGS. 6–13, advantageous details of the invention.

FIG. 6 shows a redundant word line decoder RWDEC with an arrangement for generating the inhibit signal INHIB that is suitable for use in the present invention. It includes a typical decoder arrangement RWDEC1 with inputs for the second part WL2AD, WL2AD, of the word line address signals WLAD, along with the fuses (not shown separately for the sake of simplicity) that are typical in redundant word line decoders of the prior art, with which the decoding arrangement RWDEC1 is programmable to a certain combination of the second part WL2AD, WL2AD* of the word line address signals WLAD. The decoding device RWDEC1 also includes an input for a redundant block selection signal RBKS for activating the decoding arrangement RWDEC1. If the redundant block selection signal RBKS has an inactive state (for instance, log. 0), then the output signal OUT of the decoding arrangement RWDEC1 likewise has an inactive state (for instance, likewise log. 0), regardless of what combination of signals of the second part WL2AD, WL2AD, is applied to the input, since the decoding arrangement RWDEC1 is inactive because of the nonactivated redundant block selection signal RBKS. This situation prevails in operation of the semiconductor memory of the invention whenever the particular memory field block unit BK that contains the redundant word line decoder RWDEC in question is not to be used to select a redundant word line RWL (under the control of the first part BKAD) of the word line signals WLAD and the associate redundant block decoder RBK). By suitable, known provisions, it can furthermore be assured that the inactive state will also be adhered to in a defined way. FIG. 6 shows a first resistor R1 for this purpose, which connects the output signal OUT in a high-impedance manner to the supply potential, such as the ground potential VSS. The output signal OUT is connected via a redundant word line driver circuit RWDVR with the particular redundant word line RWL that is associated with the redundant word line decoder RWDEC in question. The output signal OUT is also carried to the gate of a transistor T. The source of the transistor T is connected to a supply potential VCC that carries high potential. The drain of the transistor T is connected to the ground potential VSS via a second high-impedance resistor R2. The inhibit signal INHIB appears at the drain. If the output signal OUT is inactive, as described above, then the transistor T is blocked, so that the inhibit signal INHIB, because of its high-impedance connection with the ground potential VSS, is likewise inactive. However, if some other redundant word line decoder RWDEC (rather than the one in question) of the integrated semiconductor memory is selected, then because of the different redundant word line decoder RWDEC, the inhibit signal INHIB is in the active state. In that case, a small transverse current flows across the second resistor R2, but this is no problem given suitable dimensioning.

Contrarily, if the redundant block selection signal RBKS at the further input of the redundant decoder arrangement RWDEC1 has an active state (which is known to be the case whenever any—arbitrary—redundant word line RWL is to be triggered within the particular memory field block unit BK within which the word line decoder RWDEC question is disposed), then the following two cases must be distinguished from one another:

a) the redundant decoder arrangement RWDEC1 is not programmed for the current combination applied of the second part WL2AD of the word line address signals WLAD;

b) the redundant decoder arrangement RWDEC1 is programmed for the current combination applied of the second part WL2AD of the word line address signals WLAD.

In case a) there is no difference from the function described above of the entire redundant word line decoder RWDEC along with the inhibit signal INHIB, since the redundant decoder arrangement RWDEC1 does not respond to the applied combination of the second part WL2AD of the word line address signals WLAD.

In case b), contrarily, the redundant decoder arrangement RWDEC1 responds to the aforementioned combination. As a result, its output signal OUT assumes the active state (such as log. 1). The corresponding redundant word line RWL is selected via the redundant word line driver RWDVR. At the same time, however, the transistor T is made conducting. As a result, the inhibit signal INHIB assumes the value of the supply potential VCC; that is, it is activated (for example, log. 1). The transistor T should be dimensioned such that the inhibit signal INHIB will reliably assume its activated state even in consideration of the (slight) transverse current that flows across the second resistors R2 of the remaining redundant word line decoders RWDEC. One skilled in the art will also be able, by his professional competence, to provide transverse-current-free switching means instead of the second resistors R2.

Figure 7:
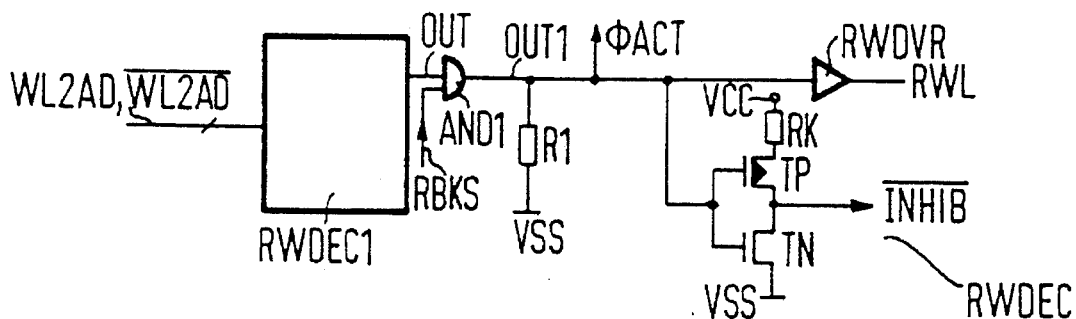

FIG. 7 shows a further embodiment of redundant word line decoders RWDEC. It is distinguished from the version of FIG. 6 in that instead of the transistor T, a CMOS inverter is now provided, having transistors TP, TN of opposing conduction types, and that the redundant block selection signal RBKS is not delivered to the redundant decoder arrangement RWDEC1 but rather is connected to its output side. To that end, an AND gate, AND1, with two inputs is interposed in the course of the line of the output signal OUT. The first input is connected to the output signal OUT, while the redundant block selection signal RBKS is present at the second input. The output signal OUT of the redundant decoder arrangement RWDEC1 is accordingly fed to the AND gate AND1 as a switched output signal OUT1 only whenever the redundant block selection signal RBKS is activated. The CMOS inverter is connected between the supply potentials VCC, VSS. The channel range of the transistor TP should be embodied such that when the transistor TP is conducting, it has high impedance, corresponding to the second resistor R2 of FIG. 6, which is symbolically represented by a drawn-in resistor RK. The transistor TN, contrarily, should be embodied with low impedance. The function of the redundant word line decoder RWDEC of FIG. 7 is the same as that described for FIG. 6, except that the polarity of the inhibit signal INHIB is reversed from that of FIG. 6 because of the CMOS inverter, so that the activated state of the inhibit signal INHIB now corresponds to that of a logical zero, while the inactive state corresponds to that of a logical one (negative logic, also known as "negative going"). The inhibit signal INHIB is therefore shown in FIG. 7 as "INHIB,".

Figure 8:
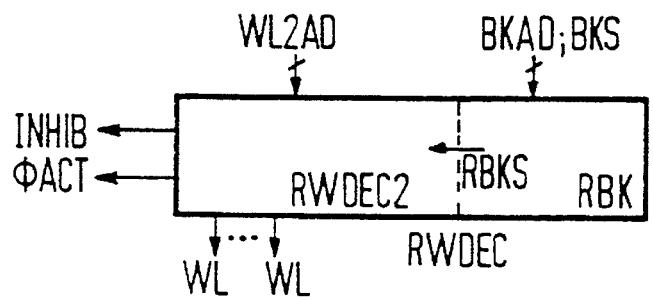

FIG. 8 shows an embodiment in which a redundant word line decoder RWDEC contains both the plurality of redundant word line decoder units, along the lines of each individual one of the redundant word line decoders of FIGS. 6, 7, and a programmable redundant block decoder RBK. The programmable redundant block decoder RBK is accordingly a component of a redundant word line decoder RWDEC having a plurality of individual redundant word line decoder units.

Figure 9:
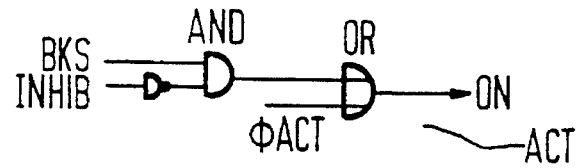

FIG. 9 shows a possible embodiment of the activation arrangement ACT of a memory field block unit BK. Positive logic is again assumed for its function. The block selection signal BKS is supplied to a first input of an AND gate AND. A second input of the AND gate AND is acted upon by the inhibit signal INHIB in inverted form. If the block selection signal BKS is activated, then a value of log. 1 is present at the first input; otherwise it is log. 0. If the inhibit signal INHIB is activated (that is, log. 1) then the value log. 0 is present at the second input of the AND gate AND (because of the inversion); otherwise it is log. 1. As a result, a log. 1 can be created at the output of the AND gate AND only whenever, simultaneously, the block selection signal BKS is activated (that is, log. 1) and the inhibit signal INHIB is deactivated (that is, log. 0). Otherwise, a log. 0 is created. The output of the AND gate AND is connected to a first input of an OR gate OR. A second input of the OR gate OR is connected with the activation signal 0ACT of the memory field block unit BK. Accordingly, the signal 0N necessary for activating the corresponding memory field block unit BK is created in activated form at the output of the OR gate OR only whenever one of the following cases occurs with respect to this memory field block unit BK:

a) memory fields NMC (and optionally RMC as well) to be addressed are present along a normal word line NWL;

b) redundant memory cells RMC to be addressed are present along a redundant word line RWL.

In case a), the block selection signal BKS is active and the inhibit signal INHIB and the activation signal 0ACT are inactive. In case b), although the block selection signal BKS may be active (if the memory cells to be replaced are disposed along a normal word line NWL in the same memory block unit BK; but it may also be inactive (if the memory cells to be replaced are disposed along a normal word line NWL of a different memory field block unit BK). Regardless, however, the inhibit signal INHIB has activated, so that a signal of log. 0 is present at the input of the OR gate OR. However, the activation signal 0ACT is activated. In all other cases, the memory field block unit BK is not activated, because of the activation unit ACT.

Tests of the present invention have shown that this novel redundancy concept, as described above, does produce a pronounced increase in yield and the manufacture of semiconductor memories according to the invention, but this advantage is gained at the cost of higher access times than in conventional redundancy concepts. Although the loss in access time when currently feasible MOS semiconductor technologies are exploited is "only" about 3 ns, nevertheless this still means a loss of almost 5% in an otherwise possible access time of approximately 60 ns, using CMOS technology. In studies of this loss in access time, which in the final analysis is expressed as a reduction in the maximum possible operating frequency, it has been found that the loss is caused by additional gate and signal transit times that occur, compared with the conventional redundancy concepts. The cause of this is as follows:

At the onset of its activation, an activated block selection signal BKS in conventional redundancy concepts initiates the activation of the memory field block unit BK associated with that block selection signal BKS.

In the redundancy concept of the invention, contrarily, as described thus far, this is not allowed to happen: Although in those cases in which no redundant word lines RWL are to be selected, because of existing word line address signals WLAD, the onset of the activation of the applicable block selection signal BKS could immediately lead to an activation of the applicable memory field block unit BK without negatively or even interferingly affecting the internal course of timing of the semiconductor memory (which otherwise is not discussed in the present description for the sake of simplicity and of restricting the discussion to the essentials), nevertheless in practice it is true that at that instant (onset of activation of one of the block selection signals BKS) it is not even known yet whether this activated block selection signal BKS can even be allowed to lead to activation of the associated memory field block unit BK, or whether instead the action of this activated block selection signal BKS should be prevented (by means of the inhibit signal INHIB) because a different memory field block unit BK is supposed to be addressed, because of a functional replacement of memory cells that is to be made. However, whether or not a replacement of memory cells is to be made is not certain until a time by which, at the latest, the inhibit signal INHIB must be activated, if in fact it is to be activated. Yet this time is certainly later (considering the longer access time by the aforementioned amount of 3 ns) than the time (in the event of nonreplacement) for activation of a block selection signal BKS:

A block selection signal BKS to be activated (by way of example—this is equally applicable to the following discussion of the redundant block decoders RBK), requires a time of t1 ns from the transfer of the word line address signals WLAD to the word line address buffer WLADBF until the time when it is in fact actuated by the block decoder BKDEC. Accordingly, a memory field block unit BK that is to be activated is activatable (in the case of nonreplacement) after t1 ns.

In the case of replacement of memory cells (the "redundancy case"), the redundant block decoders RBK effectively take over the selection as to whether a redundant word line decoder RWDEC should be selected, and if so, in which memory field block unit BK this selection should be made (activation of a redundant block selection signal RBKS). This can certainly take place within the same period of time t1 as in the above-described case of addressing of a memory cell along a normal word line NWL, so that this provision alone still produces no time lag. However, with the onset of the activation of one of the redundant block selection signals RBKS, no activation of the associated memory field block unit BK can yet be allowed, since at that moment it is still not at all certain whether in fact a redundant word line RWL is to be selected. This is not certain until after a further period of time t2 elapses, within which a redundant word line decoder RWDEC, selected by the activated redundant block selection signal RBKS, on the basis of the second part WL2AD of the word line address signals WLAD present at the semiconductor memory, either in fact selects a redundant word line RWL, or not (depending on the programming of the redundant word line decoder RWDEC). It is only then, in fact, that if a redundant word line RWL is selected, the inhibit signal INHIB can be activated, so that in the corresponding activation unit ACT, the activated block selection signal BKS is made inoperative.

What this means in practice is as follows: On the one hand, an activated block selection signal BKS must be delayed by a period of time t2, until it is certain whether or not the inhibit signal INHIB is activated, or is being activated. In the embodiments of the semiconductor memory described thus far, such a delay in the course of the block selection signals BKS is therefore necessary in order that the semiconductor memory will function reliably from the standpoint of timing as well. On the other hand, such a delay is necessary only whenever, in a given semiconductor memory, there are in fact any memory cells that are to be replaced by redundant memory cells RMC which are disposed in a different memory field block unit BK from the memory cells to be replaced.

To solve this problem, the invention now provides (see FIGS. 10, 11) that a semiconductor memory according to the invention, in other words a semiconductor memory in which the replacement redundant memory cells RMC may be disposed in a different memory field block unit BK from the memory cells to be replaced, has a programmable delay circuit DLY. This programmable delay circuit DLY is programmed (how this is done will be described hereinafter) only whenever (in the manufacture and testing of a corresponding semiconductor memory component) the redundant block decoders RBK of the semiconductor memory are programmed such that by means of the redundant word line decoders RWDEC assigned to them, at least one such redundant word line RWL is selectable in the addressing case. In a further feature of the invention, the delay circuit DLY is programmed only whenever, in the addressing case, the redundant block decoders RBK of the semiconductor memory are programmed such that by means of the redundant word line decoders RWDEC assigned to them, at least one such redundant word line RWL that is disposed in a different memory field block unit BK from the normal word line NWL whose associated memory cells are to be replaced is selectable. The programming itself can be done by the fuse technique that is conventional in redundant decoders.

Figure 10:
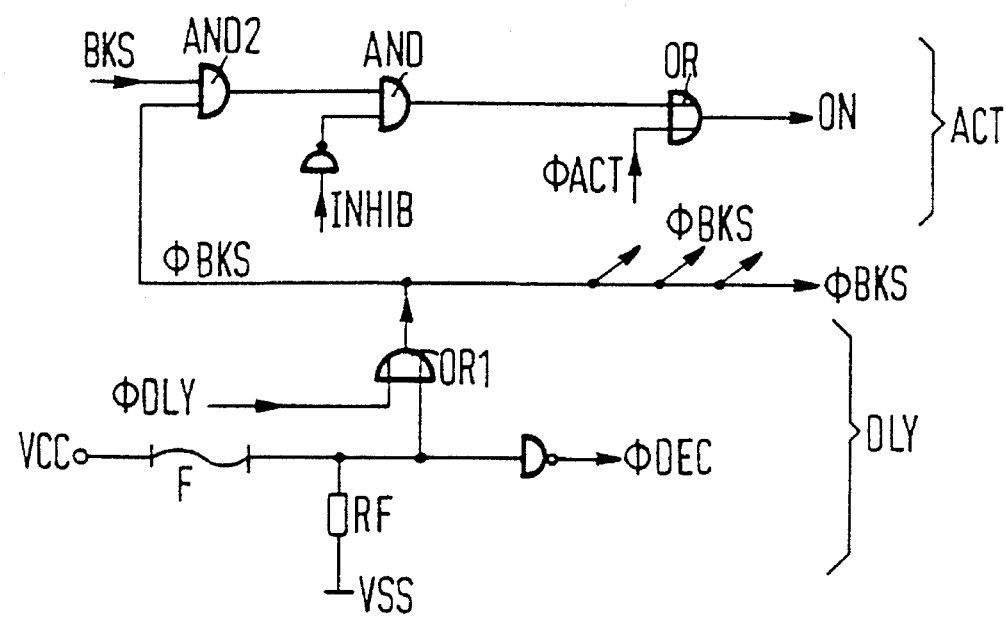

FIG. 10 shows one possible embodiment of a programmable delay circuit DLY and one of the activation units ACT that can be connected with such a programmable delay circuit DLY. The programmable delay circuit DLY contains a programmable element F (generally known as a "fuse"), which is connected at one end to a potential VCC. Since as in the above description, positive logic is assumed once again here, the potential VCC is assumed to be more-positive than a further potential VSS, which is generally called ground. The programmable element F is connected on its other end to the further potential VSS via a high-impedance resistor RF. The programmable element F is assumed to be a so-called fuse as is generally conventional in redundant technology. In the non-programmed state of the element F, essentially one potential VCC is accordingly present at one end the programmable element F (because of the high impedance of the resistor RF). In the programmed state of the element F, contrarily (that is, the programmable element F is electrically interrupted), the further potential VSS is present at the other end of the programmable element F, because of the resistor RF. The other end of the programmable element F is connected to the first input of an OR gate OR1. A second input of the OR gate OR1 is acted upon by a clock signal 0DLY. A first edge of the clock signal 0DLY is delayed, compared with a given activator block selection signal BKS, by the aforementioned defined time period t2, for example the aforementioned amount of 3 ns. At the output of the OR gate OR1, a delay signal 0DKS appears, which is supplied to each activation unit ACT of the semiconductor memory.

Figure 13:
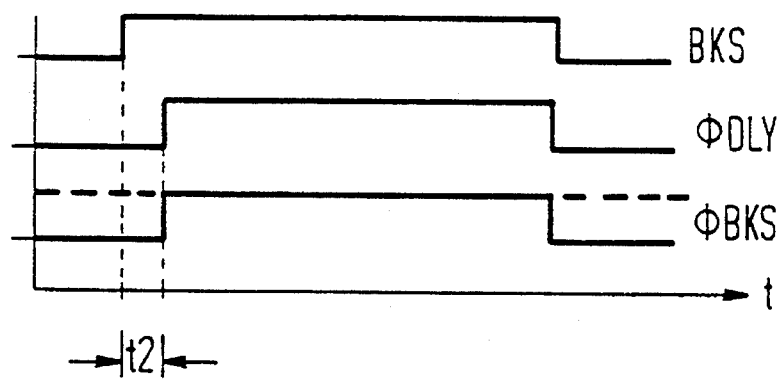

As long as the programmable element F is not programmed, the delay signal 0DKS always has the value of log. 1. However, if the programmable element F is programmed, then the delay signal 0DKS has the course of the clock signal 0DLY; in other words, the transition from log. 0 to log. 1 of the delay signal 0DKS takes place each time with a delay of at least the time period t2. This is shown in FIG. 13.

In the embodiment of FIG. 10, the activation units ACT include not only the elements known from FIG. 9 but also a further AND gate AND2 with two inputs. One input is connected to the block selection signal BKS associated with the particular activation unit ACT. The other input is acted upon by the delay signal 0DKS. While the AND gates AND of the activation devices ACT of FIG. 9 are acted upon at one input with the applicable block selection signal DKS, in the activation units of FIG. 10, this input is connected to the output of the applicable further AND gate AND2. Otherwise, the activation units ACT of the U10 are no different than those of the U9.

In a first programming case, in which the programmable element F is to be programmed whenever at least one of the redundant word line decoders RWDEC, along with the associated redundant block decoder RBK, is to be programmed, in order, when a suitable combination of word line address signals WLAD is applied to the semiconductor memory, to select a redundant word line RWL (regardless of whether the redundant word line RWL to be selected is located in the same memory field block unit BK as the normal word line NWL whose associated memory cells are to be replaced), any activated block selection signal BKS in the applicable activation unit ACT, delayed by the delay signal 0BKS, is passed on, in the programmed state of the programmable element F, to the AND gate AND and, as a function of the state of the inhibit signal INHIB, for activation of the memory field block unit BK belonging to the activation unit ACT. In the non-programmed state of the programmable F, contrarily, any activated block selection signal BKS is passed on correspondingly without delay.

Figure 11:
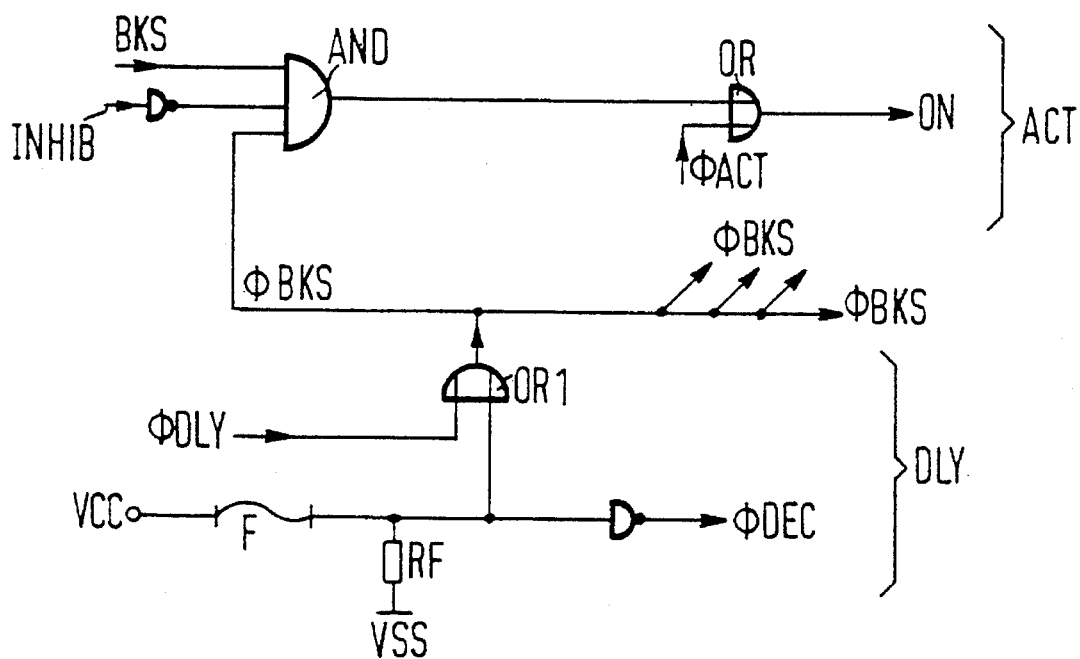
Figure 12:
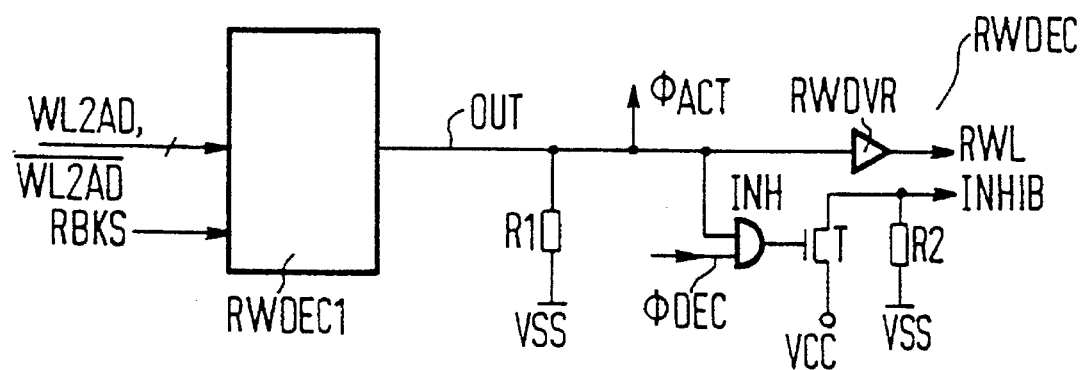

In a second programming case, in which (in contrast to the first programming case) the programmable element F is to be programmed only whenever at least one of the redundant word line decoders RWDEC along with the associated redundant block decoder RBK is to be programmed such that upon application of a suitable combination of word line address signals WLAD to the semiconductor memory, a redundant word line RWL can be selected, which is located in a different memory field block unit BK from the normal word line NWL whose associated memory cells are to be replaced, it is further provided, according to the invention, as shown in FIG. 12 that each of the redundant word line decoders RWDEC, for instance one of the kind shown in FIG. 6, has an AND gate INH, with two inputs. One input is acted upon by the output signal OUT of the decoder arrangement RWDEC1. The other input is connected via an inverter to the other end of the programmable element F of the delay circuit DLY (signal 0DEC in FIG. 11). The output of the AND gate INH is connected to the gate of the transistor T. With this arrangement, the inhibit signal INHIB is accordingly activatable only whenever, first, inapplicable redundant word line decoder RWDEC selects a redundant word line RWL (the output signal OUT of the applicable decoder arrangement RWDEC1 is activated) and the programmable element F is programmed. Thus in the second case in question (see above), it is accordingly possible, in a semiconductor memory whose redundant block decoder RBK and redundant word line decoder RWDEC either are not programmed at all, or are programmed such that redundant word lines RWL with replacement redundant memory cells RMC are located solely in the same applicable memory field block unit BK as the applicable normal word lines NBL having the memory cells to be replaced (that is, the programmable element F should not be programmed, in the second case), a memory field block unit BK to be activated at a given time is activatable without delay by means of an activation unit ACT upon the occurrence of its activated block selection signal BKS, while otherwise (that is the programmable element F is programmed) and activation can occur only in delayed fashion, since the delay signal 0BKS, because of the influence of the clock signal 0DLY, becomes operative in the activation units ACT, for instance as in FIG. 10.

The embodiment of an activation unit ACT of FIG. 11 differs from that of FIG. 10 in that the two AND gates AND and AND2 of FIG. 10 are combined in FIG. 11 into a single AND gate AND having three inputs. One input is connected to the applicable block selection signal BKS. The second input is connected via an inverter to the inhibit signal INHIB. The third input is connected to the delay signal 0BKS. Functionally, there is no difference from the embodiment of FIG. 10.

We claim:

1. An integrated semiconductor memory with redundancy arrangement, which has the following characteristics:

normal memory cells (NMC), which are disposed in a plurality of memory field block units (BK) that are individually activatable via associated activation units (ACT);

the memory field block units (BK) are activatable via their activation units (ACT) by means of block selection signals (BKS), and the block selection signals (BKS) can be generated by block decoders (BKDEC) from a first part (BKAD) of word line address signals (WLAD) that can be applied to the semiconductor memory;

the normal memory cells (NMC) are addressable per memory field block unit (BK) via normal word lines (NWL) and normal bit lines (NBL, NBL*);

normal word line decoders (NWDEC) for selecting a normal word line (NWL) in a memory field block unit (BK) as a function of a second part (WL2AD) of the word line address signals (WLAD), under the control of the block selection signal (BKS) associated with the applicable memory field block unit (BK);

bit line decoders (BDEC) for selecting a normal bit line (NBL, NBL*) as a function of bit line address signals (BLAD) that can be applied to the semiconductor memory;

redundant memory cells (RMC) in the memory field block units (BK) along redundant word lines (RWL);

programmable redundant word line decoders (RWDEC) in the memory field block units (BK) for selection of a redundant word line (RWL) as a function of the second part (WL2AD) of the word line address signals (WLAD), in the case in which on the basis of a programming that has been carried out of a redundant word line decoder (RWDEC), memory cells along normal word lines (NWL) are to be functionally replaced via redundant memory cells (RMC) that are addressable via an applicable redundant word line (RWL), characterized by at least one programmable redundant block decoder (RBK) for selection of the redundant word line decoders (RWDEC), both in cases in which a redundant word line (RWL) to be selected, having replacement redundant memory cells (RMC), is located in the same memory field block unit (BK) as the normal line (NWL) having the memory cells to be replaced, and in cases in which a redundant word line (RWL) to be selected, having replacement redundant memory cells (RMC), is disposed in an arbitrary different memory field block unit (BK) from the normal word line (NWL) having the memory cells to be replaced.

2. The integrated semiconductor memory of claim 1, characterized in that the at least one programmable redundant block decoder (RBK) is connected on an input side to the first part (BKAD) of the word line address signals (WLAD), and that in the programmed state it generates redundant block selection signals (RBKS) for triggering the redundant word line decoders (RWDEC) in the memory field block units (BK).

3. The integrated semiconductor memory of claim 1, characterized in that when more than one programmable redundant block decoder (RBK) is present, the programmable redundant block decoders (RBK) are disposed in each memory field block unit (BK) with redundant word lines (RWL).

4. The integrated semiconductor memory of claim 1, characterized in that when more than one programmable redundant block decoder (RBK) is present, the programmable redundant block decoders (RBK) are disposed in the memory field block units (BK);

that the programmable redundant block decoders (RBK) are connected on the input side with all the block selection signals (BKS); and that the programmable block decoder (RBK) of an applicable memory field block unit (BK) is programmable such that in the programmed state, on its output side it activates a redundant block selection signal (RBKS) for triggering the redundant word line decoders (RWDEC) of that memory field block unit (BK) also whenever the memory cells to be replaced are located in a different one from the applicable memory field block unit (BK).

5. The integrated semiconductor memory of claim 1, characterized in that an applicable one of the redundant word line decoder (RWDEC) triggered by the redundant block decoder (RBK) generates an inhibit signal (INHIB), which is common to all the memory field block units (BK) and has an activated state, for inhibiting all the activation units (ACT) of the semiconductor in the case in which the applicable redundant word line decoder (RWDEC), on the basis of the second part (WL2AD) of the word line address signals (WLAD), selects one of the redundant word lines (RWL), while the inhibit signal (INHIB) otherwise has an inactive state.

6. The integrated semiconductor memory claim 1, characterized in that each of the memory field block units (BK) contains an activation signal (0ACT), which has an activated state if on the one hand one of the redundant word line decoders (RWDEC) in the applicable memory field block unit (BK) is selected by the applicable redundant block selection signal (RBKS), and if on the other hand this selected redundant word line decoder (RWDEC), on the basis of the applied second part (WL2AD) of the word line address signals (WLAD), selects a redundant word line (RWL), and which otherwise has an inactive state, in which the activation signal (0ACT) in its activated state takes on the function of the block selection signal (BKS) that is responsible for the applicable memory field block unit (BK), so that the applicable memory field block unit (BK) is activated, by means of its activation unit (ACT), despite the activated state of the inhibit signal (INHIB).

7. The integrated semiconductor memory of claim 1, characterized in that the programmable redundant block decoders (RBK) are part of the redundant word line decoders (RWDEC).

8. The integrated semiconductor memory of claim 5, characterized in that by means of the inhibit signal (INHIB) in the activated state, a deactivation of the block decoder (BKDEC) is effected, instead of a deactivation of the activation units (ACT).

9. The integrated semiconductor memory of claim 5, characterized in that by means of the inhibit signal (INHIB) in the inactivated state, a deactivation of the block decoder (BKDEC) takes place in addition to the deactivation of the activation units (ACT).

10. The integrated semiconductor memory claim 1, characterized in that it has a programmable delay circuit (DLY), which in the programmed state delays the activation of an activated block selection signal (BKS) of an applicable memory field block unit (BK) by a predetermined period of time (t2), while in the non-programmed state, no delay takes place.

11. The integrated semiconductor memory of claim 10, characterized in that the delay circuit (DLY), in the non-programmed state, prevents an activation of the inhibit signal (INHIB).

12. The integrated semiconductor memory of claim 10, characterized in that the delayed activation takes place in the activation unit (ACT) of the applicable memory field block unit (BK).

13. The integrated semiconductor memory of claim 11, characterized in that the prevention of the activation of the inhibit signal (INHIB) takes place in the redundant word line decoders (RWDEC).

14. The integrated semiconductor memory of claim 10, characterized in that the programmability is dictated by a programmable element (F).

15. The integrated semiconductor memory of claim 10, characterized in that the delay circuit (DLY) is programmed only in the case in which, on the basis of programming undertaken, any one of the redundant block decoders (RBK) and any one of the redundant word line decoders (RWDEC) is programmed.

16. The integrated semiconductor memory of claim 10, characterized in that the delay circuit (DLY) is programmed only in the case in which, on the basis of programming undertaken of at least one redundant word line decoder (RWDEC), along with the associated redundant block decoder (RBK), at least one of the redundant word line (RWL) with replacement redundant memory cells (RMC) is disposed in a different memory field block unit (BK) from a corresponding normal word line (NWL) having the memory cells that are to be replaced.

* * * * *